US006422766B1

(12) United States Patent
Althaus et al.

(10) Patent No.: US 6,422,766 B1
(45) Date of Patent: Jul. 23, 2002

(54) HOUSING CONFIGURATION FOR A LASER MODULE

(75) Inventors: Hans-Ludwig Althaus, Lappersdorf; Franz Auracher, Baierbrunn, both of (DE)

(73) Assignee: Siemens Aktiengesellschaft AG, Munich (DE)

(*) Notice: Subject to any disclaimer, the term of this patent is extended or adjusted under 35 U.S.C. 154(b) by 0 days.

(21) Appl. No.: 09/722,084

(22) Filed: Nov. 27, 2000

Related U.S. Application Data (63) Continuation of application No. PCT/DE99/01562, filed on May 27, 1999.

(30) Foreign Application Priority Data

May 27, 1998 (DE) .......................................... 198 23 691

(51) Int. Cl.[7] ................................................ G02B 6/36
(52) U.S. Cl. .............................. 385/94; 385/92; 385/93
(58) Field of Search ................................ 385/88–94, 33, 385/36

(56) References Cited

U.S. PATENT DOCUMENTS

| 5,011,256 A | 4/1991 | Johnson et al. ................ 384/88 |
| 5,365,534 A | 11/1994 | Jannsen et al. ................ 372/36 |
| 5,412,748 A | 5/1995 | Furuyama et al. ............. 385/92 |
| 5,539,767 A | 7/1996 | Nakanishi et al. ............ 372/109 |
| 5,566,265 A | * 10/1996 | Spaeth et al. ................. 385/93 |

FOREIGN PATENT DOCUMENTS

| DE | 37 29 009 A1 | 3/1989 |
| DE | 41 06 720 A1 | 9/1991 |
| DE | 41 12 471 A1 | 10/1992 |
| DE | 43 43 494 A1 | 6/1995 |
| DE | 44 31 295 C1 | 12/1995 |
| DE | 197 04 502 C1 | 2/1998 |
| EP | 0 375 231 A2 | 6/1990 |
| EP | 0 463 214 A1 | 1/1992 |
| EP | 0 505 842 A1 | 9/1992 |
| EP | 0 664 586 A1 | 7/1995 |
| JP | 62 124 780 | 6/1987 |
| JP | 08 152 541 | 6/1996 |
| WO | WO 92/13369 | 8/1992 |

OTHER PUBLICATIONS

Preston et al. "High Performance Hermetic Package For LiNbO₃ Electro–optic waveguide devices", IEE, 1989, pp. 2/1–2/4.*

Staecker, Peter: "Microwave Circuits", Encyclopedia of Applied Physics, vol. 10, 1994, VCH Publishers, Inc., pp. 349, 371.

* cited by examiner

Primary Examiner—Phan T. H. Palmer
(74) Attorney, Agent, or Firm—Laurence A. Greenberg; Werner H. Stemer; Gregory L. Mayback (57) ABSTRACT

A housing configuration for a laser module includes a hermetically sealed module housing, which contains the laser module and has at least one laser-light-transparent exit wall portion. A carrier plate, which either forms the base of the module housing or carries a housing base of the module housing, and a device for coupling a wave guide to the housing are also provided. The carrier plate includes an RF conductor track carrier formed of a dielectric material. For the electrical RF contacting of the laser module, an RF conductor track section, which is guided on the RF conductor track carrier, is provided.

51 Claims, 8 Drawing Sheets

HOUSING CONFIGURATION FOR A LASER MODULE

CROSS-REFERENCE TO RELATED APPLICATION:

This application is a continuation of copending International Application No. PCT/DE99/01562, filed May 27, 1999, which designated the United States.

BACKGROUND OF THE INVENTION

1. Field of the Invention

The invention relates to a housing configuration for a laser module with a hermetically sealed module housing. The module housing contains the laser module and has at least one transparent wall portion. A carrier plate either forms the base of the module housing or carries a housing base of the module housing. The housing configuration also includes a device for coupling a wave guide to the module housing.

A conventional housing for cooled laser modules, a so-called butterfly housing, includes a metallic baseplate, on which a cooling element, with a laser module provided on it, and possibly further optical elements are attached. The housing is closed in a hermetically sealed manner with a metal cover that is welded or soldered to the housing. The coupling-of the optical fiber takes place via a fiber flange attached to the housing in the region of a housing window. With such a housing, data rates of over 2.5 Gbit/s can be achieved. However, due to the requirement for a hermetic sealing, the housing as such, its electrical lead-throughs and the sealing of the optical window have to meet high requirements. Furthermore, only components and materials that release no gas or vapors can be used in the housing. For these reasons, optoelectronic components provided with such housings are relatively expensive.

U.S. Pat. No. 5,566,265 discloses a so-called TO (Transistor Outline) housing, which is used for the operation of uncooled laser modules. This housing can be produced at low cost. However, it is disadvantageous that this housing cannot be used for wavelength-stable laser modules, since the temperature cannot be stabilized, and that, due to the presence of RF lead-throughs on the baseplate side in the form of glazed-in pins, which hinder RF coupling at high frequencies, this housing is only partly suitable for data rates of over 2.5 Gbit/s.

SUMMARY OF THE INVENTION

It is accordingly an object of the invention to provide a housing configuration for a laser module which overcomes the above-mentioned disadvantages of the heretofore-known housing configurations of this general type and which can be produced at low cost, makes a high data rate possible and, in particular, is also suitable for wavelength-stable cooled laser modules.

With the foregoing and other objects in view there is provided, in accordance with the invention, a housing configuration for a laser module, including:

a hermetically sealed module housing configured for receiving a laser module;

the hermetically sealed module housing having at least one laser-light-transparent exit wall portion and having a carrier plate as a base;

the hermetically sealed module housing having a cap formed of a laser-light-transparent material selected from a laser-light-transparent glass or a laser-light-transparent silicon, the cap being integrally formed and coupled to the carrier plate in a hermetically sealed manner;

the carrier plate including an RF conductor track carrier formed of a dielectric material;

an RF conductor track section guided along the RF conductor track carrier for providing an electrical RF contact to the lager module; and a coupling device connected to the hermetically sealed module housing and to be connected to an optical wave guide.

With the objects of the invention in view there is also provided, a housing configuration for a laser module, including:

a hermetically sealed module housing configured for receiving a laser module;

the hermetically sealed module housing having at least one laser-light-transparent exit wall portion and having a carrier plate as a base;

the hermetically sealed module housing having a circumferential wall formed of a laser-light-transparent pipe section;

a top plate terminating the pipe section, the top plate being a ceramic plate or a metal plate;

the carrier plate including an RF conductor track carrier formed of a dielectric material;

an RF conductor track section guided along the RF conductor track carrier for providing an electrical RF contact to the laser module; and a coupling device connected to the hermetically sealed module housing and to be connected to an optical wave guide.

With the objects of the invention in view there is further provided, a housing configuration for a laser module, including:

a hermetically sealed module housing configured for receiving a laser module;

the hermetically sealed module housing having at least one laser-light-transparent exit wall portion and having a carrier plate as a base;

the hermetically sealed module housing having a circumferential wall formed of a pipe section, the pipe section being a ceramic pipe section or a metal pipe section;

a laser-light-transparent top plate terminating the pipe section;

the carrier plate including an RF conductor track carrier formed of a dielectric material;

an RF conductor track section guided along the RF conductor track carrier for providing an electrical RF contact to the laser module; and a coupling device connected to the hermetically sealed module housing and to be connected to an optical wave guide.

With the objects of the invention in view there is additionally provided, a housing configuration for a laser module, including:

a hermetically sealed module housing configured for receiving a laser module;

the hermetically sealed module housing having at least one laser-light-transparent exit wall portion and having a carrier plate;

the hermetically sealed module housing having a housing base, that is different from the carrier plate, and having a circumferential wall;

the circumferential wall being cap-shaped in accordance with a TO housing cap and having a cover side;

the carrier plate including a body of a material with a good thermal conductivity and including an RF conductor track carrier formed of a dielectric material provided on the body on a side thereof facing the housing base;

a laser-light-transparent window being attached in a hermetically sealed manner at the cover side;

an RF conductor track section guided along the RF conductor track carrier for providing an electrical RF contact to the laser module;

the housing base being formed with a contacting bore;

a contacting pin extending in an electrically isolated manner through the contacting bore and being electrically contacted with the RF conductor track section; and a coupling device connected to the hermetically sealed module housing and to be connected to an optical wave guide.

To achieve the object of the invention, the carrier plate includes an RF conductor track carrier formed of a dielectric material, and an RF conductor track section is guided on the RF conductor track carrier for an electrical RF contacting of the laser module.

The RF conductor track section running on or in the carrier plate achieves the effect that the module housing has the desired good RF properties. At the same time, it is ensured by the carrier plate—in that it bears the housing base of the module housing or even itself forms the base of the module housing—that a good thermal coupling of the carrier plate to the laser module can always be achieved. This makes it possible for the laser module to be operated at a stable temperature and consequently for wavelength-stable laser modules to be provided, as are required for optical transmission systems with WDM (Wavelength Division Multiplexing) transmission.

A further major advantage of the invention is that a low-cost overall construction is made possible for several reasons. Firstly, the module housing as such can be produced in a very cost-saving way. If the carrier plate forms the base of the housing, the latter can be made up in a simple way of a cap placed onto the carrier plate in a hermetically sealed manner. In the other case (i.e. if the carrier plate bears the housing base), already existing, low-cost TO housings can be used for constructing the housing configuration according to the invention after shortening their lead-through pins and mounting them on the carrier plate according to the invention in the manner of an SMD (Surface Mounted Device). As a result, the known benefits of circuit configurations produced by the SMD technique are achieved. All further optical elements possibly provided, which are disposed outside the module housing, do not have to meet the requirements of a hermetically sealed construction, i.e. low-cost configurations which may contain epoxy resin can be chosen for them. The invention consequently provides a module housing which is functionally independent, can be configured in a constructionally compact way and is hermetically sealed, which forms a "core unit" for the housing configuration according to the invention and, as a result, makes a high degree of modularity or configuration variability possible for the construction of the housing configuration according to the invention.

For example, the coupling of a light guide or wave guide can take place completely separately from the module housing either on a "relocated" optical component or an outer housing.

Already completely produced and tested coupling devices can be used for the coupling, whereby yield problems in final assembly can be significantly reduced.

The RF conductor track section is preferably configured as a coplanar line or microstrip line and has a characteristic impedance in the range of 25 Ω to 50 Ω.

According to a preferred configuration of the invention, the carrier plate forming the base of the module housing is made up just by the RF conductor track carrier formed of the dielectric material. Apart from the RF conductor track section, contact pads, further conductor tracks and possibly also further components such as thin-film resistors, integrated hybrid amplifiers etc. may also be provided on such a carrier plate. A carrier plate formed of a material with good heat conduction, such as $Al_2O_3$, BeO or AlN, is preferred, because such a carrier plate has good thermal conductivity for carrying away lost heat of the laser module.

An alternative, likewise preferred configuration of the invention is characterized in that the carrier plate forming the base of the module housing is made up of the RF conductor track carrier and a metal layer provided over the RF conductor track carrier and formed in particular of Cu, a Cu/W alloy or "KOVAR." In this case, the lost heat produced by the laser module is distributed and carried away in an efficient way via the metal layer provided on the surface side. In the case of a cooling, the metal layer improves the thermal coupling of the laser module to a cooling element.

Furthermore, the RF conductor track carrier may also be configured as a multilayer printed circuit board. In this case, crossovers of conductor tracks running in different layers are made possible, and, in the presence of a sealing ring provided on the surface, the conductor tracks can be led through under the ring without any problem.

If, as already mentioned, a TO housing with its own housing base is used as the module housing, a preferred variant of the invention is characterized in that the carrier plate is made up of the RF conductor track carrier and a body of a material with good thermal conductivity, in particular metal, the RF conductor track carrier being provided above the body. Since the RF conductor track carrier in this case does not contribute to the heat dissipation, but tends to hinder it instead, it can preferably be very thin, for example configured as a foil.

A first exemplary embodiment of the housing configuration according to the invention is characterized in that an optical element is provided behind or downstream of the module housing as seen in the direction of the path of rays of the laser light beam, and in that the optical light guide or wave guide can be fixed in a mechanically stable position on the optical element. In the case of this exemplary embodiment, the already mentioned possibility created by the invention of relocating optical elements out of the hermetically sealed module housing is utilized by the coupling of the optical wave guide taking place directly on this relocated optical element.

The relocated optical element may be, for example, a deviating prism or an optical isolator.

An advantageous configuration of this solution is characterized in that the housing configuration is surrounded by a protective sheathing brought about by a foaming process and/or encapsulated with a plastic with poor heat conduction. As a result, environmental influences can be kept away from the module housing. If a cooling element, for example a Peltier cooling device, is provided, thermal isolation of the same is also achieved in an advantageous way.

The housing configuration may also be surrounded by a protective housing of plastic. This protective housing may be a simple plastic housing, the task of which is to protect the housing configuration, and in particular the relocated optical element, from dust and to prevent heat exchange by convection.

A second preferred exemplary embodiment of the invention is characterized in that an outer housing is provided behind (i.e. downstream) the module housing as seen in a direction of the path of rays of the laser light beam and in that the optical wave guide can be fixed in a mechanically stable position on the outer housing. Since the outer housing does not have to be hermetically sealed, it may be made up of lowcost materials, such as for example plastic and metal, making it possible to dispense with expensive hermetically sealed line lead-throughs and hermetically sealed windows. For the optical components provided in the outer housing, outside the hermetically sealed module housing, low-cost configurations containing plastic or epoxy resin can also be chosen.

According to an expedient configuration, the cap of the module housing may be integrally configured and be formed of a laserlight-transmitting material, for example glass or, in the case of adequately longwave laser radiation, also silicon. It is also possible, however, to construct the cap from a piece of pipe forming the circumferential walls and a top plate closing off the piece of pipe at the end. In the case of a laser module whose path of rays runs parallel to the carrier plate, the piece of pipe may be formed of a laser-light-transmitting material, for example glass or silicon. By contrast, in the case of a laser module radiating perpendicularly with respect to the carrier plate, the laser light must be able to pass through the top plate. This then is preferably formed of glass or silicon, while the piece of pipe forming the circumferential walls of the module housing may be formed from ceramic or metal.

The carrier plate is preferably coupled to a cooling element, in particular a Peltier element, provided outside the module housing, whereby wavelength-stable modules are achieved.

According to another feature of the invention, the module housing includes the carrier plate and a cap coupled in a hermetically sealed manner to the carrier plate.

According to yet another feature of the invention, the cap is of an integral configuration and is formed of a laser-light-transmitting material, in particular glass or silicon.

According to a further feature of the invention, the cap is made up of a piece of pipe forming the circumferential walls and a laser-light-transmitting top plate, the piece of pipe is formed in particular of ceramic or metal and the top plate is formed in particular of glass or silicon.

According to another feature of the invention, the cap is made up of a laser-light-transmitting piece of pipe forming the circumferential walls and a top plate, the piece of pipe is formed in particular of glass or silicon and the top plate is formed in particular of ceramic or metal.

According to yet another feature of the invention, the module housing is made up of a TO cap with a housing base provided on the carrier plate side.

According to another feature of the invention, the housing base of the module housing is provided with a contacting bore, through which a contacting pin is led in an electrically isolated manner and is in electrical contact with the RF conductor track section, a portion of the contacting pin running between the housing base and the RF conductor track section having as small a length as possible, in particular less than 1 mm.

Other features which are considered as characteristic for the invention are set forth in the appended claims.

Although the invention is illustrated and described herein as embodied in a housing configuration for a laser module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS:

FIG. 3b is a plan view of the first exemplary embodiment shown in FIG. 3a;

FIG. 4b is a plan view of the module housing shown in FIG. 4a;

FIG. 8b is a diagrammatic plan view of the module housing shown in FIG. 8a;

FIG. 11b is a diagrammatic plan view of the exemplary embodiment shown in FIG. 11a;

Figure 1:
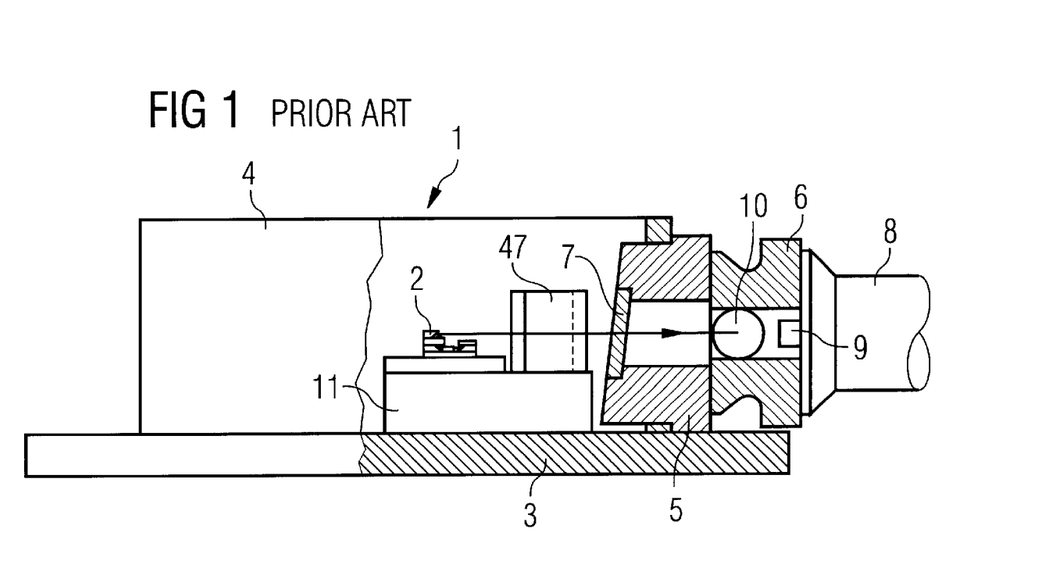
FIG. 1 is a diagrammatic, partial sectional view of a housing for cooled lager modules according to the prior art.

DESCRIPTION OF THE PREFERRED EMBODIMENTS:

Referring now to the figures of the drawings in detail and first, particularly, to FIG. 1 thereof, there is shown a conventional housing 1 for a laser module (laser submount) 2. The housing 1 includes a metallic baseplate 3, a housing cover 4 and also a housing flange 5, which is fitted in a sealing manner into the housing cover 4 at one end face of the latter. The housing flange 5 is provided with a throughbore and has a housing window 7 on its end face on the housing interior side. At the end face on the housing exterior side, the housing flange 5 is coupled to a fiber flange 6, through which a coaxial central bore passes. The fiber flange 6 fixes an optical connection fiber 9 with a protective and strain-relieving sheathing 8. In the central bore of the fiber flange 6 there is a lens 10 for the defined coupling in of the laser radiation emitted by the laser module 2 into the glass fiber 9.

The laser module 2 is mounted on a Peltier cooling element 11, which for its part stands on the metallic baseplate 3 of the housing 1. Apart from the laser module 2, the Peltier element 11 carries an optical isolator 47, which serves the purpose of avoiding effects on the laser caused by reflection.

Figure 2:
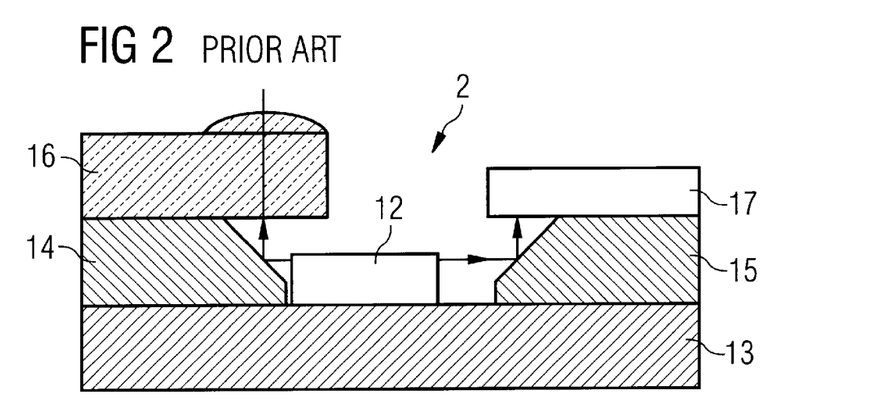
FIG. 2 is a diagrammatic cross-sectional view of a laser module according to the prior art.

FIG. 2 represents the basic construction of the laser module 2 used in FIG. 1. The laser module 2 uses a laser chip 12, which is provided on a carrier 13 formed of silicon, as the light transmitter. The carrier 13, which is also referred to as the Si submount, also carries two deviating prisms 14, 15, which are provided on both sides of the laser chip 12 and have reflecting surfaces which are oriented at an angle of 450 with respect to the active surface of the laser chip 12. On the one deviating prism 14, a coupling lens 16 has been applied and is disposed in such a way that the laser radiation produced in the laser chip 12 and deviated by the deviating prism 14 passes through the coupling lens 16 essentially in the direction of the optical axis of the latter.

On the second deviating prism 15, a monitor chip 17 has been provided and fastened in such a way that part of the optical radiation produced by the laser chip 12 is received by the monitor chip. The monitor chip 17 may be used for measuring or regulating the laser power. It is also possible here to dispense entirely with the deviating prism 15; then the monitor chip 17 can be mounted directly on the Si submount.

With the cooled laser component represented in FIGS. 1 and 2, data rates of over 2.5 Gbit/s can be achieved.

However, the high production costs on account of the Complex housing configuration are disadvantageous.

Figure 3A:
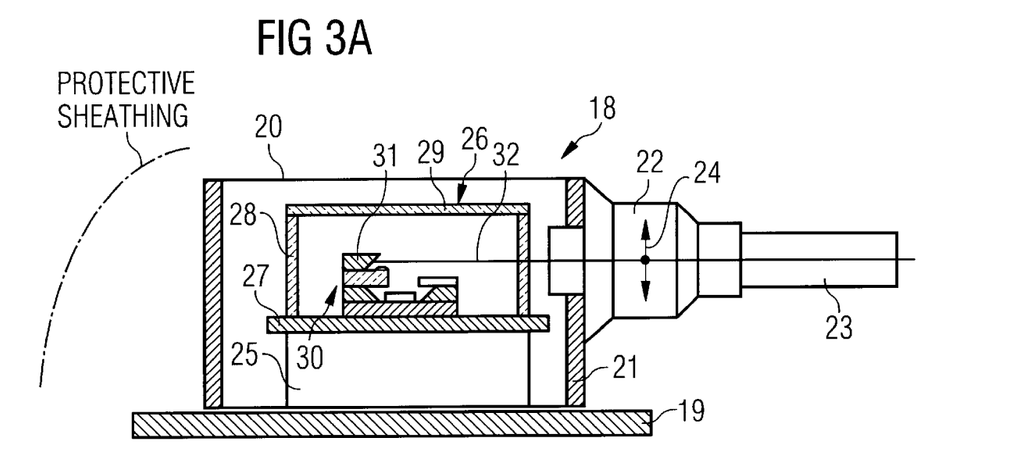
FIG. 3a is a diagrammatic sectional view of a first exemplary embodiment according to the invention, with a fiber coupling to an outer housing.

FIG. 3a shows a first exemplary embodiment according to the invention. An outer housing 18 has a baseplate 19 and also a housing cover 20 provided on the baseplate 19. Connected at one end face 21 of the housing cover 20 is a fiber flange 22, which fixes a glass fiber 23 in a mechanically stable position on the outer housing 18. The fiber flange 22 is adjustable with respect to the outer housing 18 in the direction of the double-headed arrow 24.

Inside the outer housing 18 there is a Peltier cooling element 25 and also a module housing 26 according to the invention mounted on it. The module housing 26 includes a carrier plate 27 of good heat conduction and a cap-shaped housing cover, which is made up of a laser-light-transmitting piece of pipe 28, forming the circumferential walls, and also a top plate 29, closing off the piece of pipe 28. Provided inside the module housing 26 is a laser module 30, the basic construction of which corresponds essentially to the laser module 2 represented in FIG. 2, but differs from the latter by the presence of a further deviating prism 31, which is attached directly to the coupling lens 16 (FIG. 2). The deviating prism 31 deviates the beam passing through the lens 16 through 90°, so that, behind the deviating prism 31 in the radiating direction, the laser beam 32 runs essentially parallel to the carrier 13 (laser submount) and couples into the glass fiber 26 aligned at the outer housing 18.

In the case of the type of construction represented, the fiber coupling does not take place at the module housing 26. Consequently, the latter is not subjected to any particular mechanical loads. For this reason, the module housing 26 can be of a very simple and low-cost configuration, even when there is a requirement for hermetic sealing. For example, the piece of pipe 28 may be formed from glass or a suitable semiconductor material—for longwave laser modules, silicon for example. The top plate 29 may be formed of the same material as the piece of pipe and be formed integrally with the latter. It is also possible, however, to provide a top plate of ceramic or metal.

A further advantage of the construction shown in FIG. 3a is that good thermal contact is made possible on account of the full surface contact of the carrier plate 27 as it bears against the Peltier cooling element 25. The carrier plate 27 ≅y be formed of a dielectric with good thermal conductivity, such as for example $Al_2O_3$, AlN, BeO or high-impedance Si, or, in an alternative way, a carrier plate 27 with a metal lamination of Cu/W, Cu or "KOVAR" formed on the surface side may be used, making possible an even better thermal connection of the laser module 30 to the Peltier cooling element 25.

Figure 3B:
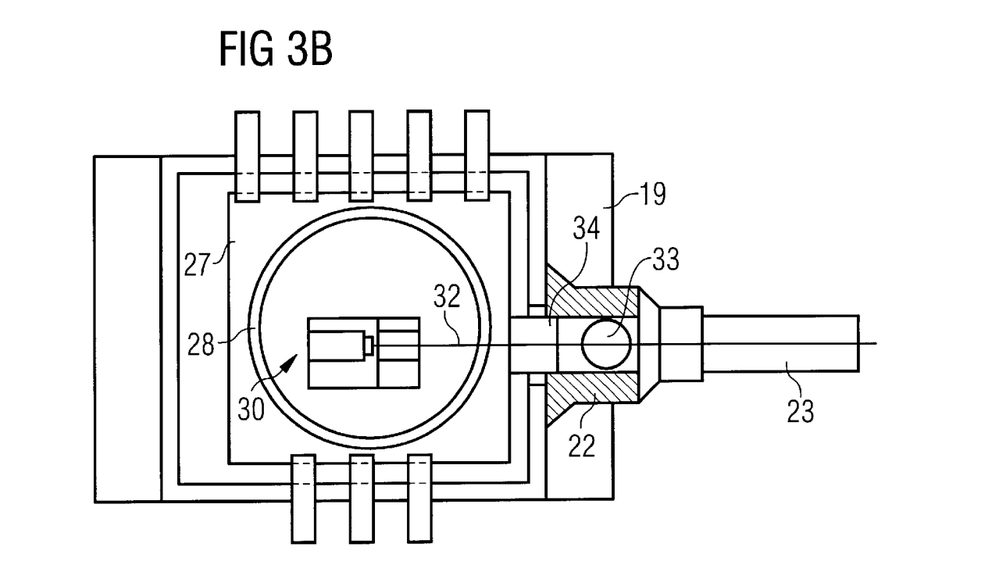

FIG. 3b shows the construction represented in FIG. 3a in plan view. For coupling the laser beam 32 into the glass fiber 23, a lens 33 is provided in a bore of the fiber flange 22. Provided in front of the lens 33 in the direction of radiation is an optical isolator 34, which is integrated into the fiber flange 22 in a hybrid manner, and the task of which is to keep reflected light away from the laser chip 12 and consequently reduce significantly effects on the laser chip 12 caused by light reflections. Such fiber flange components with or without an integrated lens 33 and optical isolator 34 can be obtained as completely produced and tested coupling units. Their use in conjunction with use of the module housing according to the invention allows to reduce yield problems in the final assembly. Since, furthermore, the optical isolator 34 is provided outside the module housing 26, low-cost isolator configurations which may contain epoxy resin can be chosen.

The laser module 30 is provided decentrally in the module housing 26. This achieves the effect that the laser beam 32 passes somewhat obliquely through the optically transmitting piece of pipe 28 and consequently light reflected at the latter is not thrown back onto the laser chip 12. Furthermore, the laser-light-transmitting piece of pipe 28 may be provided with an antireflection coating.

Figure 4A:
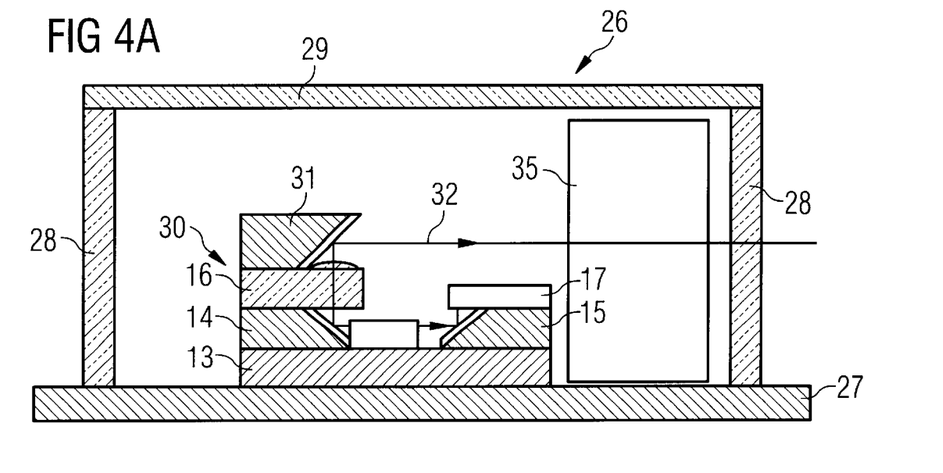
FIG. 4a is a diagrammatic sectional view of a module housing with a housing-internal double beam deviation and an integrated optical isolator.

FIG. 4a shows a schematic sectional representation of a further module housing 26. In this case, the same parts as in the previous figures are identified by the same reference numerals. The construction of the module housing 26 shown in FIG. 4a differs from the configuration according to FIG. 3a only in that the optical isolator 35 is now provided in the module housing 26. This has the advantage that light reflections occurring at the light-transmitting piece of pipe 28 can also be kept away from the laser chip 12 by the optical isolator 35. Furthermore, on account of the attachment on the carrier plate side, particularly good thermal contact of the optical isolator 35 with the Peltier cooling element 25 is created. This is of advantage, since the optical isolator 25, which can be optimized within narrow temperature ranges, can in this way be operated at a very stable temperature.

Figure 4B:
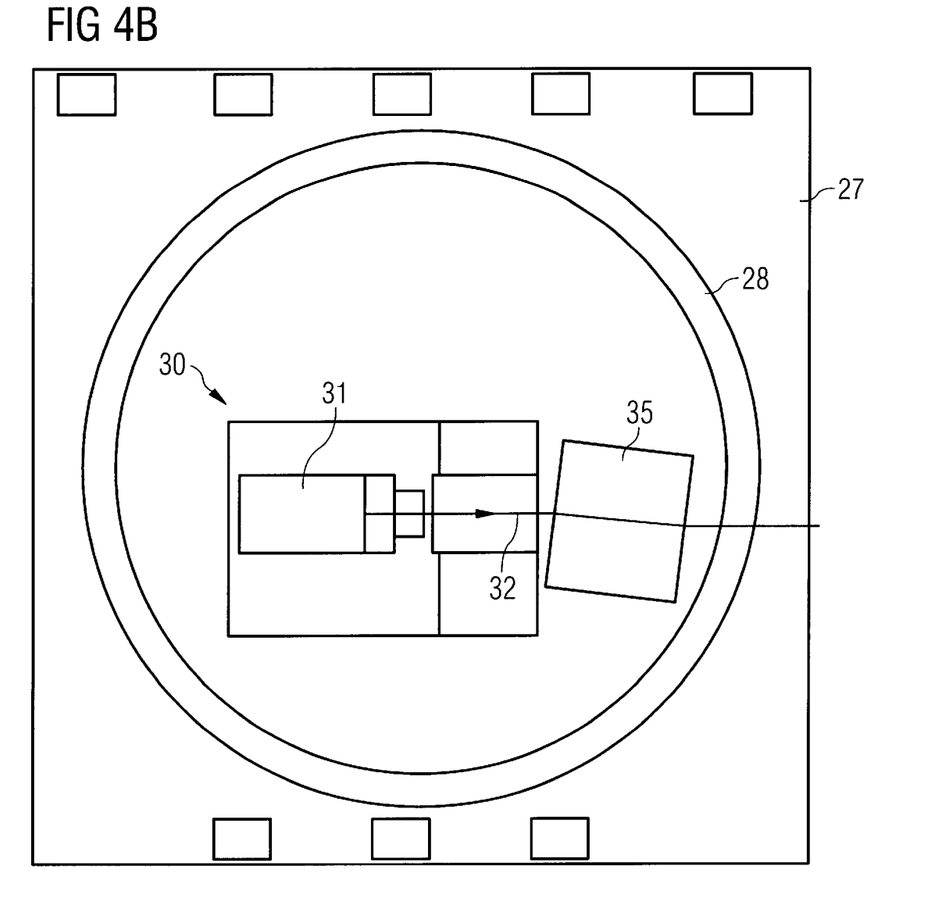

According to FIG. 4b, the laser module 30 is again provided decentrally in the cylindrical module housing cap. The axis of symmetry of the optical isolator 35 is tilted slightly with respect to the radiating direction of the laser beam 32.

Figure 5:
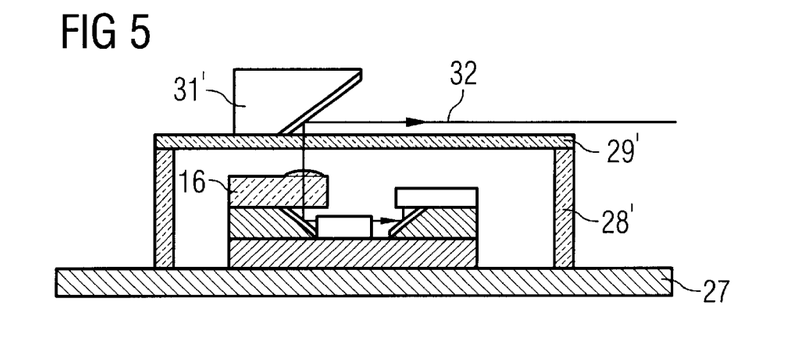
FIG. 5 is a diagrammatic sectional view of a variant of a module housing with a housing-internal single beam deviation and an external second beam deviation.
Figure 6:
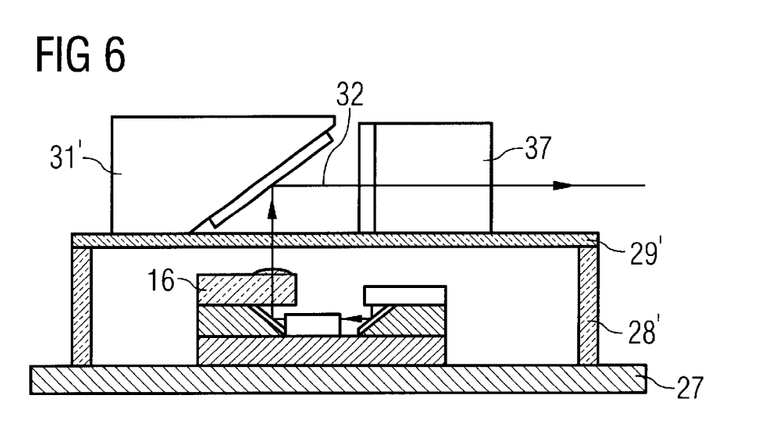
FIG. 6 is a diagrammatic sectional view of a further variant of a module housing with a housing-internal first beam deviation and an external second beam deviation and also an external optical isolator.
Figure 7:
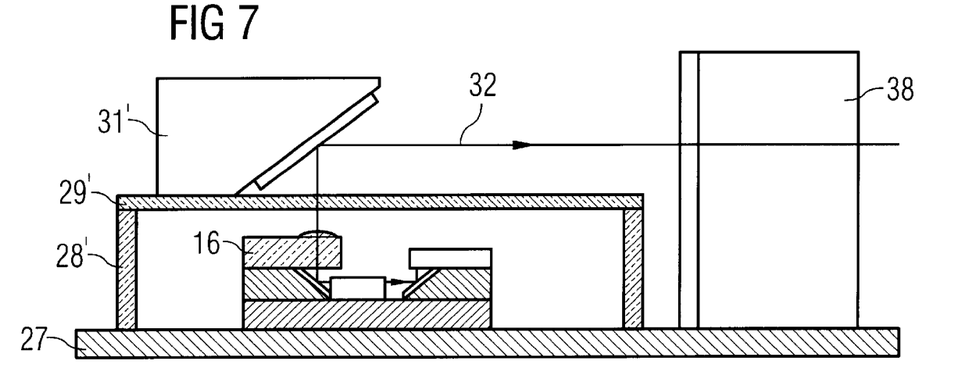
FIG. 7 is a diagrammatic sectional view of a third variant of a module housing with a housing-internal first beam deviation and an external second beam deviation and also an external optical isolator.

FIGS. 5, 6 and 7 show further examples of the configuration of optical elements on the module housing 26 according to the invention. The configurations shown in these figures share the common feature that the laser beam passing through the coupling lens 16 leaves the module housing 26 through the laser-light-transmitting top plate 29' of the latter and is then deviated by a second deviating prism 31', attached to the top plate 29', through 90° in the horizontal direction. The top plate 29' may be of glass or a suitable semiconductor material transparent to the laser light. To avoid effects on the laser, the top plate 29' is provided with an antireflection coating and the laser beam is sent through the top plate 291 slightly obliquely at an angle of, for example, 5° to 8° with respect to the normal of the top plate. The latter can be achieved either by providing the top plate 29' obliquely or more simply by tilting the beam of the laser module by corresponding adjustment of the coupling lens 16.

In FIGS. 5, 6 and 7, the piece of pipe 28' may also be formed of a material opaque to laser light, for example metal or ceramic or the like. A hermetically sealed connection of the piece of pipe 28' to the carrier plate 27 may be established, for example, by welding, soldering or glazing on. All the configurations shown in FIGS. 5 to 7 may be used in the case of the first exemplary embodiment according to FIGS. 3a, 3b.

In FIG. 6, an optical isolator 37 is provided in the direct vicinity of the second deviating prism 31' on the top plate 29'. As an alternative to this, an optical isolator 38 may also be attached to the carrier plate 27, according to FIG. 7. On account of the good thermal contact with the carrier plate 27 and the fact that the optical isolator 38 allows temperature-sensitive optimization, this configuration is of advantage particularly whenever a cooling of the laser module is planned.

Figure 8A:
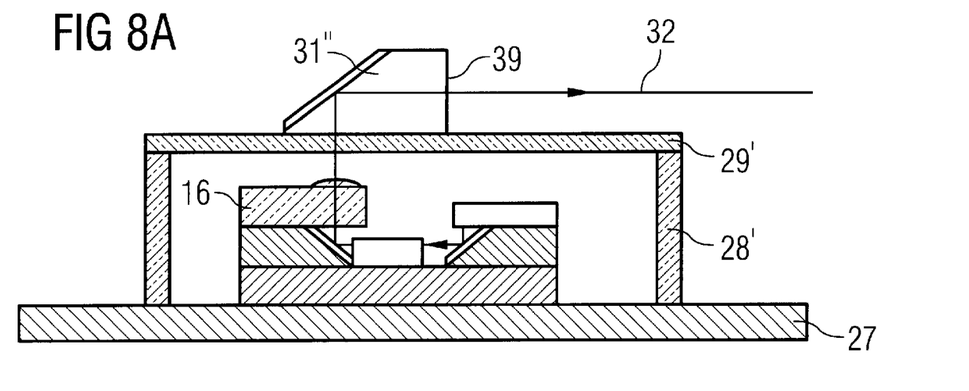
FIG. 8a is a diagrammatic sectional view of a fourth variant of a module housing with a housing-internal first beam deviation and a further possibility for an external second beam deviation.
Figure 8B:
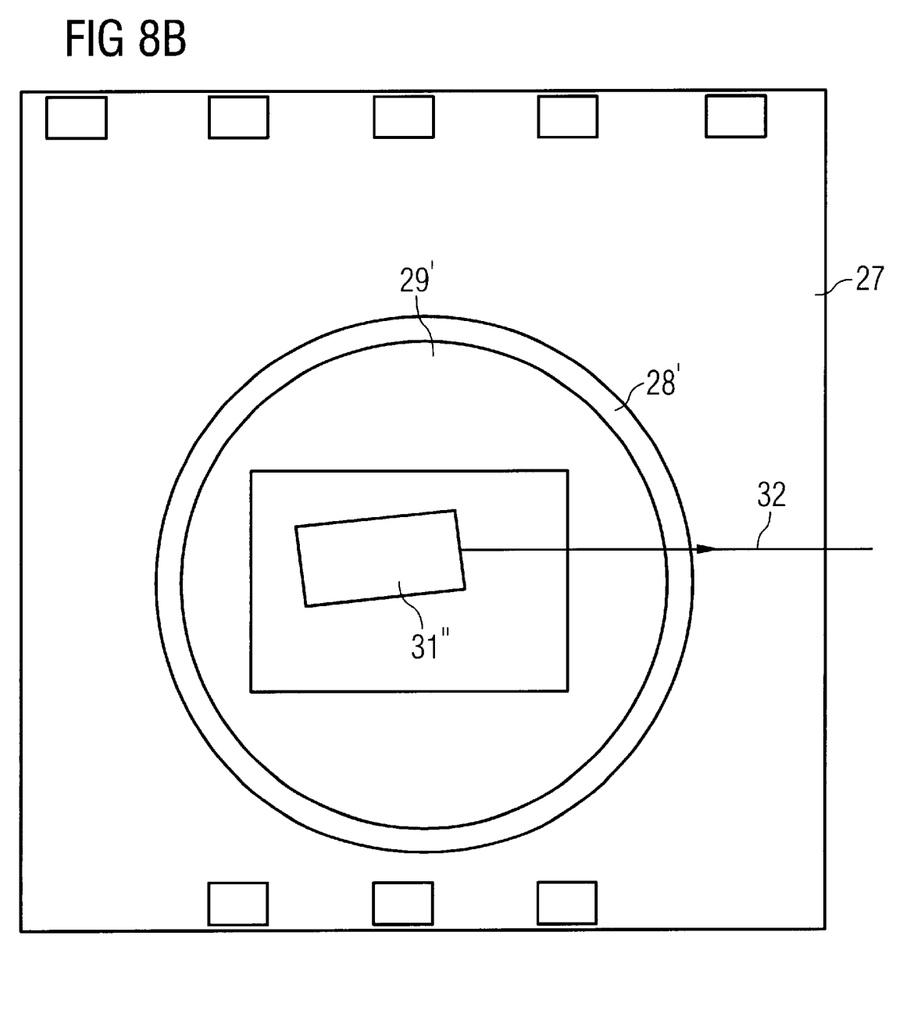

FIGS. 8a and 8b show a further example of a laser module housing 26 with a beam emergence or beam exit on the cover side. In comparison with the examples represented in the previous figures, this configuration differs only by the form of the beam deviation in the second deviating prism 31". In the case of the variant represented here, it is expedient to provide the emergent surface or exit surface 39 of the deviating prism 31" with an antireflection coating and, furthermore, to provide a beam emergence inclined with respect to the surface, as is shown in FIG. 8b. This is achieved by the axis of symmetry of the second deviating prism 31" being turned slightly with respect to the radiating direction of the laser beam 32.

Figure 9:
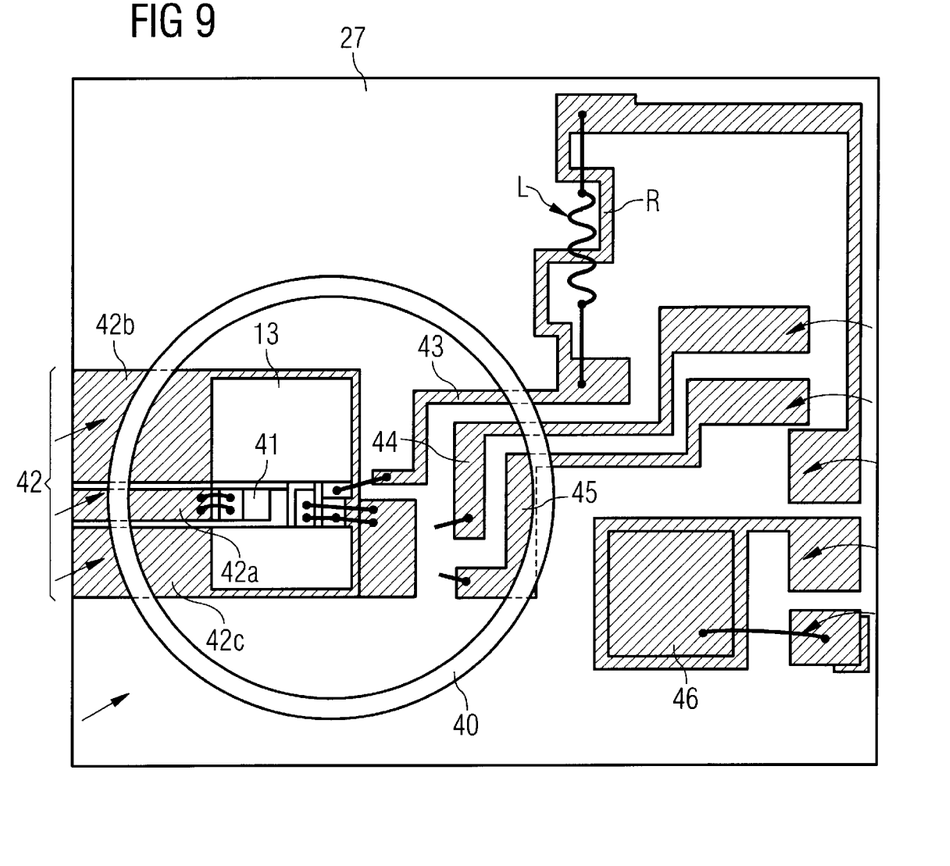
FIG. 9 is a diagrammatic plan view of a carrier plate with electrical components and line paths provided on it.

FIG. 9 shows a carrier plate 27 in plan view, revealing the line paths, contact pads and electrical components not represented in the previous figures. For the hermetically sealed attachment of a cap, a peripheral or annular sealing ring 40 has been applied to the carrier plate 27, formed for example of metal and not only forming a sealed connection with the carrier plate 27 but also making possible a hermetically sealed connection with the cap to be applied, for example by soldering, welding or a similar method. In the inner region of the sealing ring 40 there is the carrier 13 of a laser module, which may likewise be fastened on the carrier plate 27 by adhesive bonding, soldering or welding. The carrier 13 is provided on its surface with a pattern of conductor tracks, which electrically contacts a laser chip and for its part is contacted by external leads. An RF data signal is supplied via a coplanar line 42, which has a central conductor strip 42a for the RF data signal and two neighboring conductor strips 42b and 42c connected to ground, the central conductor strip 42a being connected to the electrical element 41. The conductor track strips 42a, 42b, 42c have been applied to a conductor-track carrier layer of the carrier plate 27 formed of a dielectric material. On the opposite side, the pattern of conductor tracks is electrically contacted by three leads 41, 44, 45, which supply the laser chip, according to the above-specified sequence, via an RF inductor L and a parallel film resistor R with a bias current and also the electrical connection to the monitor chip 17. Furthermore, a temperature sensor 46, configured as an NTC resistor, is formed on the carrier plate 27 with the corresponding electric leads and contact pads.

In order not to impair the hermetic sealing between the sealing ring 40 and the carrier plate 27 when using a metallic sealing ring 40, and on the other hand to exclude the possibility of an electrical short circuit with the sealing ring 40, the conductor tracks 42, 43, 44 and 45 are led through under the sealing ring 40 and separated from the latter by a dielectric isolating layer.

In the example shown, the temperature sensor 46 and also the integrated film resistor R and the RF inductor L lie outside the sealing ring 40 and can therefore be readily soldered with flux or cast with casting resin. However, it is also possible to provide the sealing ring 40 along a path lying further outward, in which for example only the external terminal pads lie outside the sealing ring 40, and consequently outside the module housing 26 according to the invention.

Figure 10:
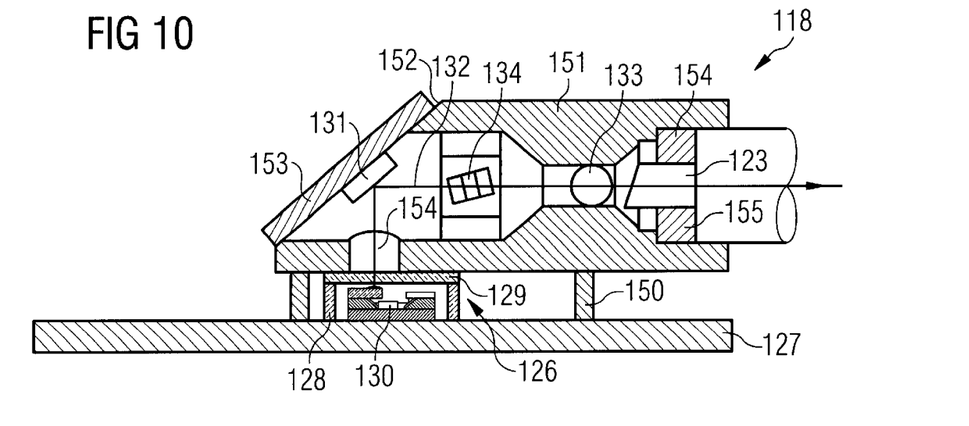
FIG. 10 is a diagrammatic sectional view of a second exemplary embodiment of the invention, with a fiber coupling on an outer housing.

FIG. 10 shows a second exemplary embodiment according to the first aspect of the present invention. A laser module 130 is provided on a metallic carrier plate 127 with a dielectric RF conductor track carrier running on the surface side and is accommodated in a laser module housing 126, the cap of which is formed by a piece of pipe 128 and also a transparent top plate 129. The construction of the laser module housing 126 corresponds to one of the laser module housings 26 described above with a beam emergence on the cover side. Provided above the laser module housing 126 is an outer housing 118, which is carried by a spacer ring 150, resting on the carrier plate 127, and is fixed in its position in relation to the laser module housing 126 through the use of the spacer ring. The outer housing 118 has a housing body 151 made of metal and formed in the manner of a pipe connecting piece. The one end of the housing body 151 is configured as a sloping surface region 152, to which a terminating plate 153 with a deviating mirror 131 is attached. A laser beam leaving the laser module housing on the cover side passes through an opening 154 into the housing body 151 and is deviated by the deviating mirror 131 in a colinear manner with respect to the housing axis. Inside the housing body 151 there is an optical isolator 134 and also a lens 133. At its end opposite the sloping surface region 152, the housing body has a connection bore 154, into which a connector part 155 of an optical waveguide cable with a central glass fiber 123 can be inserted with an exact fit and in a defined position. The glass fiber 123 is preferably provided with a ground bevel at its free end. The light beam is indicated with reference numeral 132.

Figure 11A:
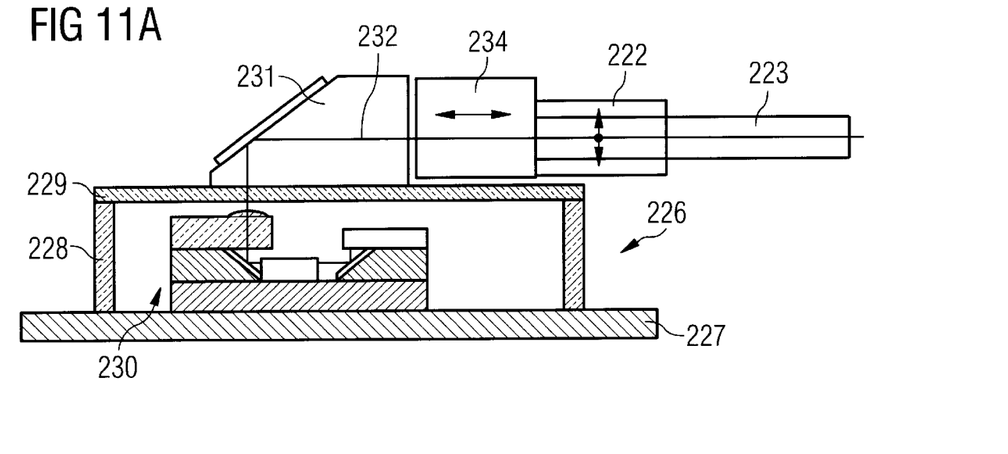
FIG. 11a is a diagrammatic sectional view of a third exemplary embodiment, with a fiber coupling on an optical isolator.
Figure 11B:
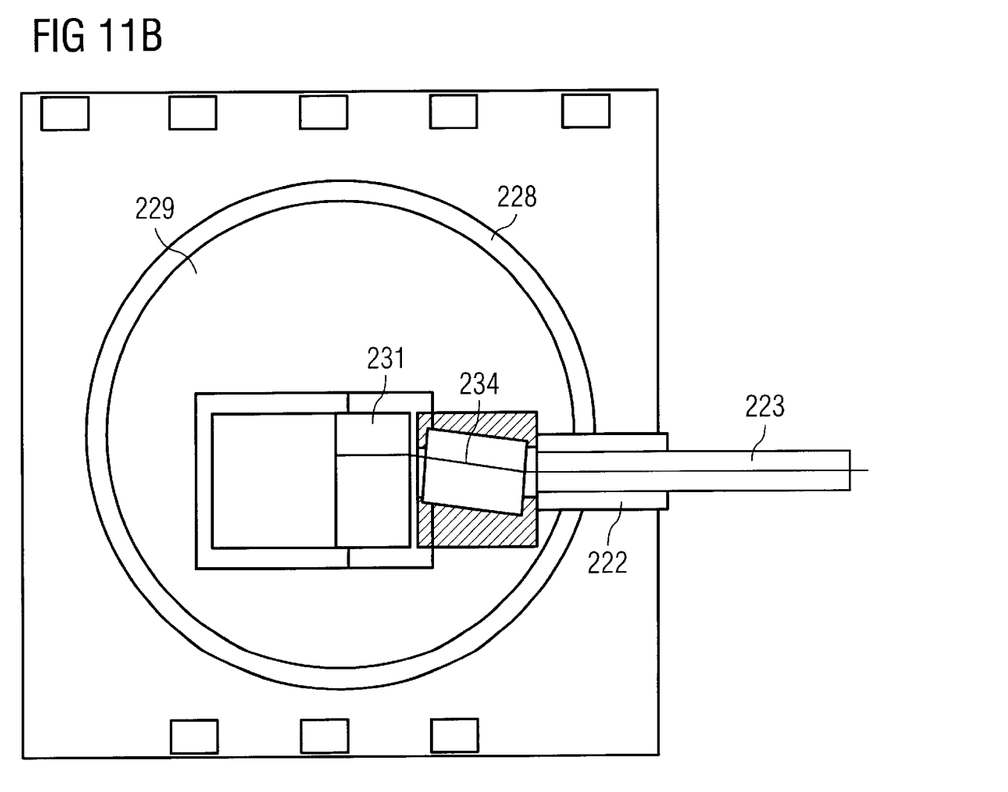

The mode of operation of this second embodiment is as follows:

The coupling lens 16 (FIG. 2) provided in the laser module 130 produces a greatly magnified intermediate image, which typically has 4 to 5 times the spot diameter of the monomode glass fiber 123. This has the consequence that the distance between the coupling lens 16 and the lens 133 is uncritical. The lens 133 then reduces this intermediate image to the spot size of the glass fiber 123 to be coupled, whereby a high coupling efficiency is achieved. This type of construction makes it possible to use prefabricated and tested outer housings 118 including a housing body 151, a deviating mirror 131, possibly an optical isolator 134 and a lens 133 and subsequently to couple this outer housing 118 in the way represented to a likewise separately produced and checked laser module housing 126 according to the invention. To optimize the coupling-out of light, the two housings 118, 126 must be adjusted and fixed in terms of their position in relation to each other. The fixing may take place by laser welding on the spacer ring 150. FIGS. 11a and 11b show a third exemplary embodiment of the invention, in which, unlike in the exemplary embodiments previously described, the fiber coupling does not take place on an outer housing but on an optical component. A laser module 230 is accommodated in a laser module housing 226, which is made up in the same way as that represented in FIGS. 8a and 8b of a carrier plate 227, a piece of pipe 228 and a top plate 229. In a way likewise analogous to FIGS. 8a and 8b, a deviating prism 231 is attached to the top plate 229 and deviates the laser light emitted by the laser module 230 into a laser beam 232 running parallel to the plane of the carrier plate 227. Directly behind the deviating prism 231 in the radiating direction there is an optical isolator 234, which is likewise attached to the top plate 229 and, for adjustment purposes, is displaceable in the direction parallel to the radiation. The light-exit surface of the optical isolator 234 is connected— for example by an adhesive bond—securely to a fiber flange 222 of a glass fiber 223. The optical isolator 234 is adjusted in the direction of the fiber axis and the fiber flange 222 is adjusted transversely to the fiber axis with respect to the optical isolator 234. If no optical isolator 234 is provided (for example in the case of modules with a somewhat lower data rate), the fiber flange 222 may also be fixed directly to the deviating prism 231.

FIG. 11b shows the configuration represented in FIG. 11a in plan view and illustrates the beam offset in the optical isolator 234.

This exemplary embodiment has the same advantages as the first two exemplary embodiments with respect to its suitability for a hermetic sealing and for a coupling of a cooling element.

In particular when a cooling element is used in the way already described, it may be expedient to protect the entire unit from environmental influences and heat exchange by an encapsulating foaming or encapsulating with a plastic of poor heat conduction. It is also possible in this way to achieve a strain relief of the glass fiber.

Figure 12:
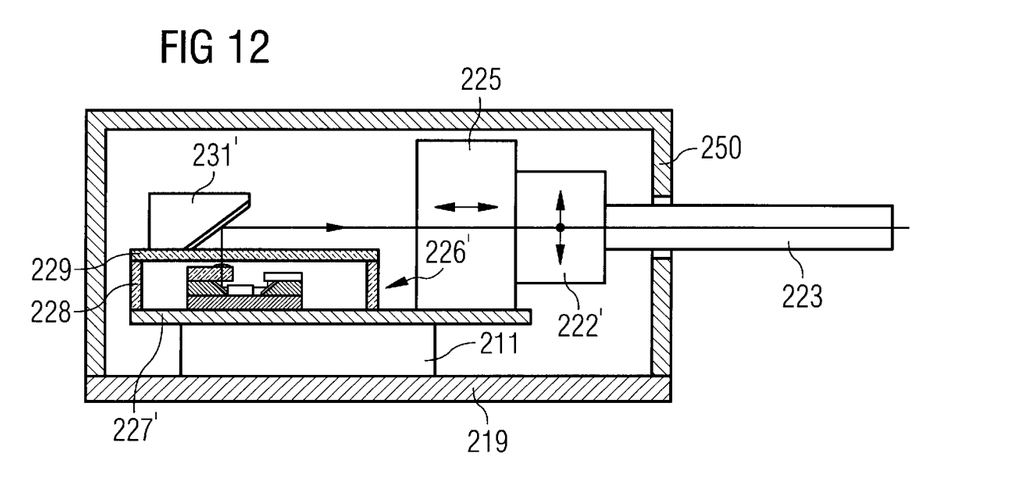
FIG. 12 is a diagrammatic sectional view of a variant of the exemplary embodiment shown in FIGS. 11a, 11b, with a protective housing.

FIG. 12 shows a variant of the third exemplary embodiment, represented in FIGS. 11a, 11b, the same parts being identified by the same reference numerals. Here, too, the coupling of a fiber flange 222' takes place directly at an optical isolator 235. As a difference from the third exemplary embodiment, however, the optical isolator 235 is attached to the carrier plate 227' in contact with a Peltier cooling element 221, whereby good stabilization of the temperature of the optical isolator 235 is brought about. Furthermore, a deviating prism 231' provided with a reflection coating on the front side has been chosen.

A Peltier cooling element 211 is mounted on a baseplate 219, onto which a simple protective shroud 250 made of a plastics material is placed and which surrounds the entire construction. The protective shroud or hood 250 protects the optical components provided outside the module housing 226' from dust and prevents heat exchange by convection.

All the exemplary embodiments represented are comparable in their functionality and are always distinguished by the principle of using the module housing according to the invention as a core unit for laser optics. This construction principle achieves a high degree of configuration variability and modularity, whereby low-cost configurations can be realized, in particular for hermetically sealed and/or cooled components.

Figure 13:
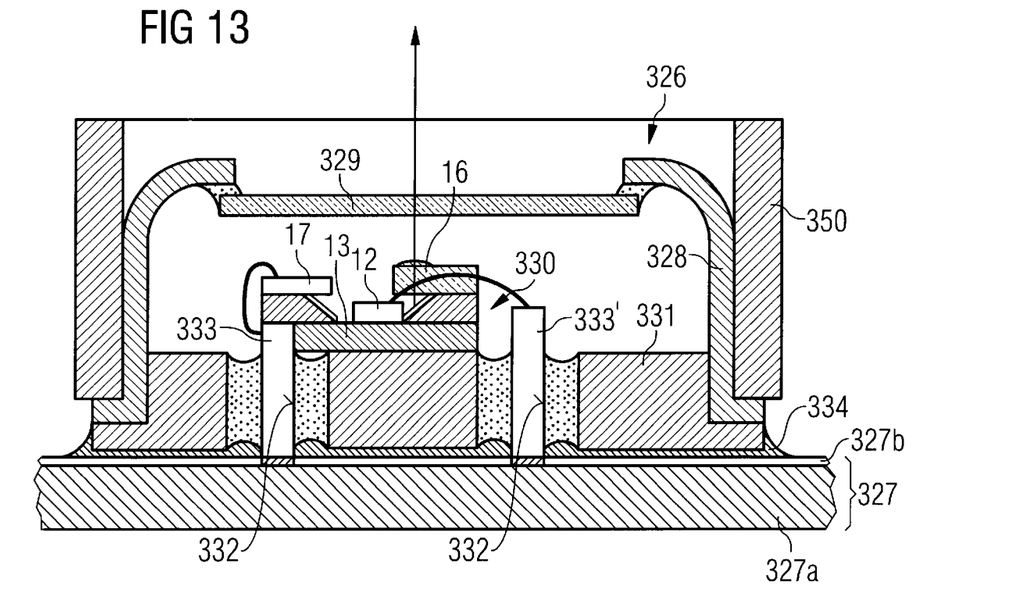
FIG. 13 is a diagrammatic sectional view of a further TO module housing, which can be used with the housing configuration according to the invention.

FIG. 13 shows a further example of a module housing 326 with a laser module 330 provided inside the housing. The laser module 330 corresponds to the laser module, represented in FIG. 2. The module housing 326 has a cap, including a circumferential wall 328 and a window 329, attached on the cover side in a hermetically sealed manner and corresponding to the cap used in the case of customary TO housings. The cap is surrounded by a spacer ring 350, via which the module housing 326 can be coupled, for example as represented in FIG. 10, to an outer housing. The circumferential wall 328 is welded in a hermetically sealed manner to a housing base 331 carrying the laser module 330. The housing base 331 has contacting bores 332, through which contacting pins 333, 333' extend. While the contacting pin 333' serves for leading through the RF data signal, the contacting pin 333 and further contacting pins allow the electrical contacting of the monitor chip 17, a temperature sensor possibly provided and also the bias current lead for the laser chip 13.

Underneath the housing base 331, a carrier plate 327 is provided and connected to the base through the use of an adhesive 334. The carrier plate 327 is made up of a body 327a, formed for example of metal with good thermal conductivity, and an RF conductor track carrier 327b running over the body. The RF conductor track carrier 327b leads an RF conductor track section configured as a microstrip line or coplanar line directly to the contacting pin 333'. To have good RF properties, the free length of the RF contacting pin 333' protruding out of the housing base must be as small as possible. For this reason, the distance required for the adhesive bonding between the housing base 331 and carrier plate 327 must be kept to a minimum. On account of these measures, this module housing 326 also has the desired good RF properties and at the same time the efficient thermal coupling to the carrier plate required for cooling.

In the same way as the module housings 26, 126 and 226 shown in FIGS. 5 to 8 and 10 to 12, the module housing 326 can be used in a variable way. One advantage of the module housing 326 is that the hermetic sealing of the housing can be achieved in a simple way by a resistance welding between the housing base 331 and the circumferential wall 328. It is also advantageous that even already existing TO laser module housings can be used after appropriate shortening of their lead-through pins and mounting them on a carrier plate constructed in a way according to the invention.

We claim:

1. A housing configuration for a laser module, comprising:
a hermetically sealed module housing configured for receiving
a laser module;
said hermetically sealed module housing having at least one laser-light-transparent exit wall portion and having a carrier plate as a base;
said hermetically sealed module housing having a cap formed of a laser-light-transparent material selected from the group consisting of a laser-light-transparent glass and a laserlight-transparent silicon, said cap being integrally formed and coupled to said carrier plate in a hermetically sealed manner;

said carrier plate including an RF conductor track carrier formed of a dielectric material;

an RF conductor track section guided along said RF conductor track carrier for providing an electrical RF contact to the laser module; and a coupling device connected to said hermetically sealed module housing and to be connected to an optical wave guide.

2. The housing configuration according to claim 1, wherein said carrier plate is formed entirely by said RF conductor track carrier.

3. The housing configuration according to claim 1, wherein said carrier plate further includes a metal layer provided over said RF conductor track carrier.

4. The housing configuration according to claim 3, wherein said metal layer is composed of a material selected from the group consisting of Cu, a Cu/W alloy and "KOVAR".

5. The housing configuration according to claim 1, wherein:

said carrier plate has a surface side;

a metallic sealing ring is disposed on said surface side of said carrier plate; and said RF conductor track section is guided under said metallic sealing ring and is isolated from said metallic sealing ring.

6. The housing configuration according to claim 1, wherein said RF conductor track carrier is a multilayer printed circuit board.

7. The housing configuration according to claim 1, wherein said dielectric material is a material selected from the group consisting of $Al_2O_3$, BeO and AlN.

8. The housing configuration according to claim 1, including:

an optical element provided, with respect to a laser beam path direction, downstream of said hermetically sealed module housing; and said optical element and the optical wave guide being connectable in a mechanically stable position with respect to one another.

9. The housing configuration according to claim 8, wherein said optical element is a deviating prism.

10. The housing configuration according to claim 8, wherein said optical element is an optical isolator.

11. The housing configuration according to claim 1, including a protective sheathing surrounding said hermetically sealed module housing, said RF conductor track section and said coupling device.

12. The housing configuration according to claim 11, wherein said protective sheathing is one of a foamed sheathing and a sprayed-on sheathing composed of a plastic material having a poor heat conduction.

13. The housing configuration according to claim 1, including a protective housing surrounding said hermetically sealed module housing, said RF conductor track section and said coupling device.

14. The housing configuration according to claim 13, wherein said protective housing is a plastic housing.

15. The housing configuration according to claim 1, including:

an outer housing provided, with respect to a laser beam path direction, downstream of said hermetically sealed module housing; and said outer housing and the optical wave guide being connectable in a mechanically stable position with respect to one another.

16. The housing configuration according to claim 1, including:

a cooling element provided outside said hermetically sealed module housing; and said hermetically sealed module housing being thermally coupled via said carrier plate to said cooling element.

17. The housing configuration according to claim 16, wherein said cooling element is a Peltier element.

18. A housing configuration for a laser module, comprising:

a hermetically sealed module housing configured for receiving a laser module;

said hermetically sealed module housing having at least one laser-light-transparent exit wall portion and having a carrier plate as a base;

said hermetically sealed module housing having a circumferential wall formed of a laser-light-transparent pipe section;

a top plate terminating said pipe section, said top plate being one of a ceramic plate and a metal plate;

said carrier plate including an RF conductor track carrier formed of a dielectric material;

an RF conductor track section guided along said RF conductor track carrier for providing an electrical RF contact to the laser module; and a coupling device connected to said hermetically sealed module housing and to be connected to an optical wave guide.

19. The housing configuration according to claim 18, wherein said carrier plate is formed entirely by said RF conductor track carrier.

20. The housing configuration according to claim 18, wherein said carrier plate further includes a metal layer provided over said RF conductor track carrier.

21. The housing configuration according to claim 20, wherein said metal layer is composed of a material selected from the group consisting of Cu, a Cu/W alloy and "KOVAR".

22. The housing configuration according to claim 18, wherein:

said carrier plate has a surface side;

a metallic sealing ring is disposed on said surface side of said carrier plate; and said RF conductor track section is guided under said metallic sealing ring and is isolated from said metallic sealing ring.

23. The housing configuration according to claim 18, wherein said RF conductor track carrier is a multilayer printed circuit board.

24. The housing configuration according to claim 18, including:

an optical element provided, with respect to a laser beam path direction, downstream of said hermetically sealed module housing; and said optical element and the optical wave guide being connectable in a mechanically stable position with respect to one another.

25. The housing configuration according to claim 24, wherein said optical element is a deviating prism.

26. The housing configuration according to claim 24, wherein said optical element is an optical isolator.

27. The housing configuration according to claim 18, including a protective sheathing surrounding said hermetically sealed module housing, said RF conductor track section and said coupling device.

28. The housing configuration according to claim 18, including a protective housing surrounding said hermetically sealed module housing, said RF conductor track section and said coupling device.

29. The housing configuration according to claim 18, including:
  an outer housing provided, with respect to a laser beam path direction, downstream of said hermetically sealed module housing; and
  said outer housing and the optical wave guide being connectable in a mechanically stable position with respect to one another.

30. The housing configuration according to claim 18, including:
  a cooling element provided outside said hermetically sealed module housing; and
  said hermetically sealed module housing being thermally coupled via said carrier plate to said cooling element.

31. A housing configuration for a laser module, comprising:
  a hermetically sealed module housing configured for receiving a laser module;
  said hermetically sealed module housing having at least one laser-light-transparent exit wall portion and having a carrier plate as a base;
  said hermetically sealed module housing having a circumferential wall formed of a pipe section, said pipe section being one of a ceramic pipe section and a metal pipe section;
  a laser-light-transparent top plate terminating said pipe section;
  said carrier plate including an RF conductor track carrier formed of a dielectric material;
  an RF conductor track section guided along said RF conductor track carrier for providing an electrical RF contact to the laser module; and
  a coupling device connected to said hermetically sealed module housing and to be connected to an optical wave guide.

32. The housing configuration according to claim 31, wherein said carrier plate is formed entirely by said RF conductor track carrier.

33. The housing configuration according to claim 31, wherein said carrier plate further includes a metal layer provided over said RF conductor track carrier.

34. The housing configuration according to claim 33, wherein said metal layer is composed of a material selected from the group consisting of Cu, a Cu/W alloy and "KOVAR".

35. The housing configuration according to claim 31, wherein:
  said carrier plate has a surface side;
  a metallic sealing ring is disposed on said surface side of said carrier plate; and
  said RF conductor track section is guided under said metallic sealing ring and is isolated from said metallic sealing ring.

36. The housing configuration according to claim 31, wherein said RF conductor track carrier is a multilayer printed circuit board.

37. The housing configuration according to claim 31, including:
  an optical element provided, with respect to a laser beam path direction, downstream of said hermetically sealed module housing; and
  said optical element and the optical wave guide being connectable in a mechanically stable position with respect to one another.

38. The housing configuration according to claim 37, wherein said optical element is a deviating prism.

39. The housing configuration according to claim 37, wherein said optical element is an optical isolator.

40. The housing configuration according to claim 31, including a protective sheathing surrounding said hermetically sealed module housing, said RF conductor track section and said coupling device.

41. The housing configuration according to claim 31, including a protective housing surrounding said hermetically sealed module housing, said RF conductor track section and said coupling device.

42. The housing configuration according to claim 31, including:
  an outer housing provided, with respect to a laser beam path direction, downstream of said hermetically sealed module housing; and
  said outer housing and the optical wave guide being connectable in a mechanically stable position with respect to one another.

43. The housing configuration according to claim 31, including:
  a cooling element provided outside said hermetically sealed module housing; and said hermetically sealed module housing being thermally coupled via said carrier plate to said cooling element.

44. A housing configuration for a laser module, comprising:
  a hermetically sealed module housing configured for receiving a laser module;
  said hermetically sealed module housing having at least one laser-light-transparent exit wall portion and having a carrier plate;
  said hermetically sealed module housing having a housing base being different from said carrier plate and having a circumferential wall;
  said circumferential wall being cap-shaped in accordance with a TO housing cap and having a cover side;
  said carrier plate including a body of a material with a good thermal conductivity and including an RF conductor track carrier formed of a dielectric material provided on said body on a side thereof facing said housing base;
  a laser-light-transparent window being attached in a hermetically sealed manner at said cover side;
  an RF conductor track section guided along said RF conductor track carrier for providing an electrical RF contact to the laser module;
  said housing base being formed with a contacting bore;
  a contacting pin extending in an electrically isolated manner through said contacting bore and being electrically contacted with said RF conductor track section; and
  a coupling device connected to said hermetically sealed module housing and to be connected to an optical wave guide.

45. The housing configuration according to claim 44, including:
  an optical element provided, with respect to a laser beam path direction, downstream of said hermetically sealed module housing; and
  said optical element and the optical wave guide being connectable in a mechanically stable position with respect to one another.

46. The housing configuration according to claim 45, wherein said optical element is a deviating prism.

47. The housing configuration according to claim 45, wherein said optical element is an optical isolator.

48. The housing configuration according to claim 44, including a protective sheathing surrounding said hermetically sealed module housing, said RF conductor track section and said coupling device.

49. The housing configuration according to claim 44, including a protective housing surrounding said hermetically sealed module housing, said RF conductor track section and said coupling device.

50. The housing configuration according to claim 44, including:

an outer housing provided, with respect to a laser beam path direction, downstream of said hermetically sealed module housing; and said outer housing and the optical wave guide being connectable in a mechanically stable position with respect to one another.

51. The housing configuration according to claim 44, including:

a cooling element provided outside said hermetically sealed module housing; and said hermetically sealed module housing being thermally coupled via said carrier plate to said cooling element.

* * * * *